(12) United States Patent
Tan et al.

(10) Patent No.: US 10,969,873 B2
(45) Date of Patent: Apr. 6, 2021

(54) DETECTING VIBRATIONS GENERATED BY A SWIPE GESTURE

(71) Applicant: Dell Products L. P., Round Rock, TX (US)

(72) Inventors: Geroncio Ong Tan, Austin, TX (US); Timothy Carlyle Shaw, Austin, TX (US); Tsu Yi Kuo, New Taipei (TW); Ting-Chang Chang, New Taipei (TW)

(73) Assignee: Dell Products L P, Round Rock, TX (US)

(*) Notice: Subject to any disclaimer, the term of this patent is extended or adjusted under 35 U.S.C. 154(b) by 56 days.

(21) Appl. No.: 16/382,332

(22) Filed: Apr. 12, 2019

(65) Prior Publication Data
US 2020/0326781 A1    Oct. 15, 2020

(51) Int. Cl.
*G01R 31/371* (2019.01)
*G06F 3/01* (2006.01)
(Continued)

(52) U.S. Cl.
CPC ......... *G06F 3/017* (2013.01); *G01R 31/3646* (2019.01); *G01R 31/371* (2019.01); *G06F 3/167* (2013.01)

(58) Field of Classification Search
CPC ........ H04R 1/406; H04R 1/1083; H04R 1/00; H04R 3/005; H04R 3/00; H04R 17/00; H04R 2410/05; H04R 7/045; H04R 2400/01; H04R 2400/03; H04R 2499/11; H04R 2499/15; G06F 3/041; G06F 3/0436; G06F 3/043; G06F 3/0433; G06F 3/0488; G06F 3/017; G06F 3/04883; G06F 2200/1636; G06F 3/038; G06F 3/0416; G06F 3/016; G06F 3/167; G06F 3/04847; G06F 3/16; G06F 3/162; G06F 3/165; G06F 3/0446; G06F 3/0447; G06F 3/0448; G06F 3/03547; G06F 3/03548; G06F 1/1694; G06F 1/1688; G06F 1/1684; G06F 1/169; G06F 2203/0339; G06F 2203/04809;
(Continued)

(56) References Cited

U.S. PATENT DOCUMENTS

2001/0003452 A1* 6/2001 Linge ............... G06F 3/043
                                                   345/179
2010/0201226 A1* 8/2010 Bostrom ............ H04R 17/00
                                                    310/336
(Continued)

*Primary Examiner* — Nitin Patel
*Assistant Examiner* — Amen W. Bogale
(74) *Attorney, Agent, or Firm* — Campbell Stephenson LLP

(57) ABSTRACT

In some examples, a computing device may include a swipeable portion with a material having a textured surface. A primary sensor may receive motion-generated data when a swipe gesture is performed on the swipeable portion and send primary data to an embedded controller (EC). The primary sensor may be mounted between two layers of vibration damping material. The EC may filter the primary data to create filtered data. The EC may determine that the filtered data satisfies one or more criteria to determine that the swipe gesture was performed. In response, the EC may perform one or more associated actions, such as determining and displaying a battery level of a battery of the computing device.

17 Claims, 6 Drawing Sheets

US 10,969,873 B2

Page 2

(51) Int. Cl.
*G01R 31/36* (2020.01)
*G06F 3/16* (2006.01)

(58) Field of Classification Search
CPC ........ G06F 2203/04106; H04M 1/026; H04M 1/0266; H03K 2217/96003; G10L 21/0208; G10L 2021/02165
See application file for complete search history.

(56) References Cited

U.S. PATENT DOCUMENTS

| | | | |
|---|---|---|---|
| 2011/0096036 A1* | 4/2011 | McIntosh ................ | G06F 3/043 345/177 |
| 2011/0134063 A1* | 6/2011 | Norieda ................ | G06F 3/0433 345/173 |
| 2011/0293102 A1* | 12/2011 | Kitazawa ............. | G06F 3/0433 381/56 |
| 2013/0022214 A1* | 1/2013 | Dickins .................. | G06F 3/043 381/74 |
| 2016/0165350 A1* | 6/2016 | Benattar ................ | H04S 7/304 381/310 |
| 2017/0285843 A1* | 10/2017 | Roberts-Hoffman ...................... | G06F 3/0488 |
| 2017/0350916 A1* | 12/2017 | Dubbeldeman ...... | G10K 11/002 |
| 2018/0246591 A1* | 8/2018 | Huijser .................. | G06F 3/167 |
| 2019/0138155 A1* | 5/2019 | Li ......................... | G06F 3/0416 |

* cited by examiner

DETECTING VIBRATIONS GENERATED BY A SWIPE GESTURE

BACKGROUND OF THE INVENTION

Field of the Invention

This invention relates generally to detecting touch generated vibrations on a portable computing device and, more particularly to detecting when a user has deliberately swiped a particular area and performing one or more actions in response.

Description of the Related Art

As the value and use of information continues to increase, individuals and businesses seek additional ways to process and store information. One option available to users is information handling systems (IHS). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems, such as laptops, tablets, and smartphones, continue evolve and become sleeker and more minimalistic. One way to provide a dedicated control surface for various functions (e.g., power on and the like) is to use touch-sensitive (e.g., touch-capacitance) materials. However, touch-sensitive controls cannot typically be used with metal or metallic coated cases. Another way to provide a dedicated control surface is to detect when a user has deliberately touched or swiped a particular area. However, such a control surface may be susceptible to false triggering from normal handling, finger tapping, being transported in a bag, incidental rubbing, and he like.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing device may include a swipeable portion with a material having a textured surface. A primary sensor may receive motion-generated data (e.g., vibration data, acoustic signal data, and/or audio data) when a swipe gesture is performed on the swipeable portion and send primary data to an embedded controller (EC). The primary sensor may be mounted between two layers of vibration damping material. The EC may filter the primary data to create filtered data. The EC may determine that the filtered data satisfies one or more criteria to determine that the swipe gesture was performed. In response, the EC may perform one or more associated actions, such as determining and displaying a battery level of a battery of the computing device.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
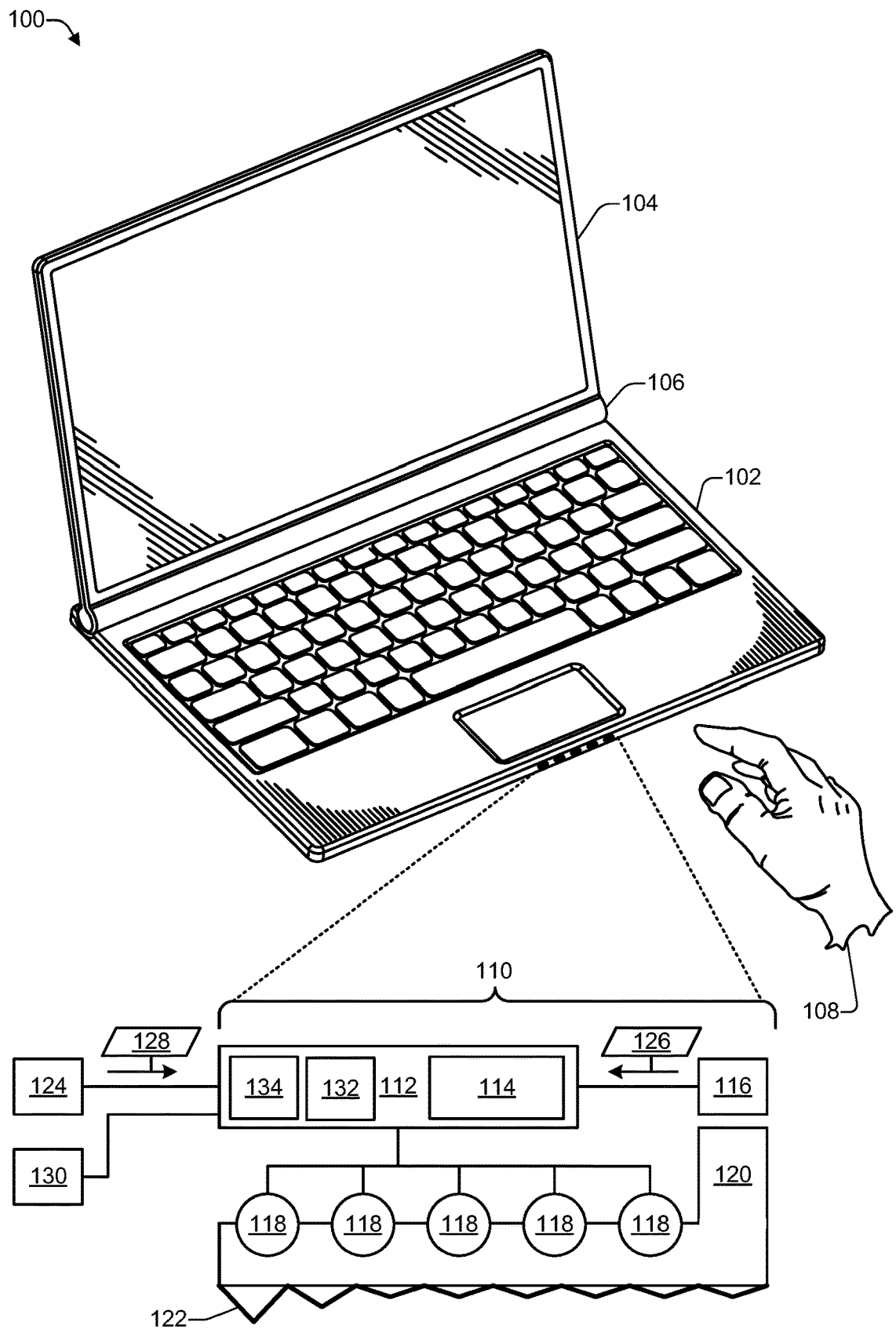
FIG. 1 is a block diagram of a system that includes a computing device having a swipeable portion, according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques enable detection of a user swiping a particular (e.g., swipeable) portion of a computing device while rejecting false triggers. A false trigger occurs when vibrations not caused by a swipe gesture trigger an action that is to be performed when a swipe gesture is detected. For example, a portable computing device (e.g., laptop, tablet, smartphone, smartwatch, or the like) may enable the user to perform a swipe gesture to a particular (e.g. swipeable) portion of the computing device to perform one or more actions, such as determining and temporarily displaying an amount of battery life remaining in battery, raising or lowering (e.g., depending on a direction of the swipe) a volume of a audio output, a brightness of a display device, a contrast of the display device, or another action related to the computing device. A swipe is a deliberate gesture performed by a user to a particular portion of the computing device in which the user (i) places a part of an appendage (e.g., a tip of a finger) in contact with one end of the particular portion and then (ii) drags the part of the appendage to the other end of the particular portion, within a predefined amount of time (e.g., less than or equal to X milliseconds, such as 500 milliseconds). The swipeable portion of the computing device where the user may perform the swipe gesture ("swipe") may be located on a side of an enclosure (e.g., housing) of the computing device, on a bezel of a display device, near an input device (e.g., a keyboard or a trackpad), or the like. The length of the swipeable portion of the computing device may be at least one centimeter (cm) in length. A false trigger is the accidental or unintentional triggering of one or more actions associated with a swipe gesture.

A primary (e.g., first) sensor may be placed near the swipeable portion of the computing device to detect vibrations generated by the swipe. An embedded controller (EC) may be used to receive data from the primary sensor, process the data, and perform one or more actions. In some cases, the EC may be separate from the primary sensor while in other cases the EC may be integrated into the primary sensor. The primary sensor may be an accelerometer, a microphone, or another type of transducer capable of detecting sound waves (e.g., audible frequencies). For example, in some cases, the primary sensor may be a 3-Axis accelerometer, such as the MC3451 or equivalent. The primary sensor may be mounted (e.g., sandwiched) in an enclosure (e.g., housing) of the computing device between two pieces of foam to isolate the primary sensor from other vibrations that may be transmitted by the enclosure. For example, the foam may be a vibration dampening foam, such as a viscoelastic foam that translates vibrational energy into another form of energy (e.g., heat). The use of a sensor with a built-in EC may be useful to display information to a user even when the computing device is in a low power state (e.g., turned off). For example, a user entering a meeting room may perform a swipe gesture to a particular portion of a laptop computer that is turned off to determine an amount of the remaining battery life to decide whether to sit near an electrical outlet in the meeting in order to charge the battery. When the primary sensor detects vibrations, the primary sensor may wake the EC, determine that a swipe occurred, determine that the swipe is associated with a particular action (e.g., display remaining battery life), check the battery level and illuminate one or more lights to indicate the remaining battery life. Thus, the user can display the battery level without turning on the computer.

In some cases, a secondary (e.g., second) sensor may be located at a different location from the primary sensor. The second sensor may be coupled to (or at least not isolated from) the enclosure to enable the secondary sensor to capture data (e.g., vibrations) that is not generated by a user swipe. The secondary sensor may be used to provide noise rejection. For example, if both the primary sensor and the secondary sensor detect vibrations, then the data from both sensors may be compared to determine whether the user performed a swipe gesture. To illustrate, if the amplitude of secondary vibrations detected by the secondary sensor is equal to or exceeds the amplitude of primary vibrations detected by the primary sensor, then the EC may determine that the user did not perform a swipe gesture. If the amplitude of secondary vibrations detected by the secondary sensor is less than the amplitude of primary vibrations detected by the primary sensor, then the EC may determine that the user performed a swipe gesture.

To increase the amplitude of vibrations generated by a user swipe, textured (e.g., striated) material may be placed along the swipeable portion of the computing device where the user may perform the swipe. When the user performs a swipe gesture to the particular (e.g., swipeable) portion of the computing device, the amplitude of the vibrations created by swiping the textured material may be higher than the amplitude of the vibrations created when the user is using an input device (e.g., keyboard, trackpad, or the like), when the user's hand brushes against a different (e.g., nonstriated and therefore smoother) portion of the enclosure, when the enclosure of the computing device rubs against a carrying bag in which the computing device has been placed, or the like. The striated material may include bumps having more than one height, such as, for example, bumps having (i) a first height, (i) a second height, and, in some cases, at least a third height. For example, the size of each bump may be tuned to create a vibration with a particular frequency (e.g., greater than 300 hertz (Hz)). In this example, swiping a first bump with a first height may cause a vibration with a first frequency, swiping a second bump with a second height may cause a vibration with a second frequency, swiping a third bump with a third height may cause a vibration with a third frequency, and so on. By adjusting the frequencies of the bumps of the textured material and by filtering the data received from the sensors, a swipe gesture performed along the particular portion of the computing device can be detected while rejecting other non-swipe generated vibrations. For example, if the bumps produce frequencies with the range of 400-500 Hz, then a lowpass filter (or a bandpass filter) may be used to process the data received from the sensors to filter out frequencies below 400 Hz (or below 400 Hz and above 500 Hz for a bandpass filter). Such a swipe can be used to trigger the computing device to perform one or more actions, such as, for example, temporarily (e.g., for Y seconds, such as between 1 to 10 seconds, displaying a remaining battery life).

In addition, when multiple bump sizes are used, the direction of a swipe can be determined. For example, assume the first bump with the first height generated a first frequency of 400 Hz and is located near a left most end of the particular portion of the computing device and assume the second bump with the second height generates a second frequency of 500 Hz and is located near the right most end of the particular portion. After receiving and filtering the data from the primary sensor, if the data indicates that the frequency 400 Hz occurred before the frequency 500 Hz, then the swipe was left to right and if the data indicates that the frequency 500 Hz occurred before the frequency 400 Hz, then the swipe was right to left. A user may store a configuration in a user preference file indicating what action (e.g., which settings or parameters are changed) to perform when a swipe in a particular direction is performed. For example, the user preference file may specify that volume of an audio output or speaker is increased when a swipe from left to right is detected and the volume is decreased when a swipe from right to left is detected. The amount of change in volume may be proportional to the length of the swipe or the speed of the swipe, e.g., a longer or slower swipe may reduce the volume more than a shorter or faster swipe. As another example, the user preference file may specify that brightness (or contrast) of a display device of the computing device is increased when a swipe from left to right is detected and is decreased when a swipe from right to left is detected. The amount of change may be proportional to the length of the swipe or the speed of the swipe, e.g., a longer or slower swipe may reduce the brightness (or contrast) more than a shorter or faster swipe. As a further example, the user preference file may specify that a page of a document being displayed advance to a following page when a swipe from left to right is detected and a previous page is displayed when a swipe from right to left is detected. Of course, a user may customize the user preference file to change other settings or parameters of the computing device based on a directional swipe.

Thus, a swipeable portion (e.g., a strip) located in a housing of a computing device may be programmed to perform one or more actions when a swipe gesture is detected along the particular portion. To increase the amplitude of the motion-generated data (e.g., vibration data, acoustic signal data, and/or audio data) when a swipe gesture occurs, the swipeable portion may use material (e.g., plastic or metal) that has a texture, such as striations or bumps. The size of the striations or bumps may be selected to create motion-generated data having a particular set of frequencies. The motion-generated data may be filtered (e.g., low pass or bandpass filtering) to reduce the amplitude of frequencies not included in the particular set of frequencies created by the striations or bumps, further reducing the possibility of false triggering due to other vibrations transmitted by the enclosure (e.g., housing). In some cases, two sensors may be used to further reduce the possibility of false triggering by placing a primary sensor near the particular portion of the computing device that includes the striated material and a secondary sensor located further away. The primary sensor may be mounted between vibration damping (e.g., viscoelastic) material to decouple the primary sensor from the enclosure, thereby reducing the amplitude of vibrations not originating from the swipeable portion of the computing device. The secondary sensor may be mounted further from the swipeable portion and may be coupled to the enclosure to identify vibrations being transmitted by the enclosure. For example, if the motion-generated data received by the secondary sensor has an amplitude that is the same or greater than the amplitude of motion-generated data received by the primary sensor, then no action may be performed because the motion-generated data was likely not generated by a swipe. In this way, the signal-to-noise ratio (also referred to as SNR or S/N ratio) of the motion-generated data generated by a swipe may be increased, thereby reducing false triggering due to the user incidentally brushing up against the swipeable portion and other (e.g., non-swipe generated) vibrations, such as being carried in a bag, being placed in or removed from a bag, being placed on a surface, and the like.

As a first example, a computing device may include an embedded controller (EC) to receive primary data from a primary sensor that is mounted between two layers of vibration damping (e.g., viscoelastic) material that reduces vibrations transmitted by a housing of the computing device that are received by the primary sensor. The EC may filter the primary data to create filtered data. For example, the EC may filter out frequencies not created by the swipe gesture on a swipeable portion of the computing device using a bandpass filter to create the filtered data. The swipeable portion of the computing device may include a textured surface having at least one of: a first bump having a first height to generate a first frequency, a second bump having a second height to generate a second frequency, or a third bump having a third height to generate a third frequency. The EC may determine whether the filtered data satisfies one or more criteria. For example, the EC may determine whether an amplitude of the filtered data is greater than a first threshold (e.g., 500 ms) and determine whether a length of the filtered data is greater than a second threshold. The EC may determine whether one or more input devices (e.g., keyboard, trackpad, and the like) are in use. In some cases, the EC may receive second data from a secondary sensor that is coupled to the enclosure of the computing device, filter the second data to create second filtered data, and determine whether a second amplitude of the second filtered data is less than the amplitude of the filtered data. Based on the result of the one or more determinations, the EC may determine whether a swipe gesture was performed on a swipeable portion of the computing device. If the EC determines that the swipe gesture was performed, the EC may perform one or more actions associated with the swipe gesture. In some cases, the EC may determine whether the swipe gesture was performed in a first direction or in a second direction. For example, the one or more actions associated with the swipe gesture may include performing at least one of: (i) determining and displaying, using one or more indicator lights, a battery level associated with a battery of the computing device, (ii) modifying a contrast level of a display device of the computing device to create a modified contrast level and displaying the modified contrast level using the one or more indicator lights, (iii) modifying a brightness level of a display device of the computing device to create a modified brightness level and displaying the modified brightness level using the one or more indicator lights, (iv) modifying an audio output level of the computing device to create a modified audio output level and displaying the modified audio output level using the one or more indicator lights, or (v) modifying an audio input level of the computing device to create a modified audio input level and displaying the modified audio input level using the one or more indicator lights. The one or more actions associated with the swipe gesture are performed without using one or more processors of the computing device. For example, the computing device may be in a low power state (e.g., an off state or a hibernation state) in which an operating system is inactive (e.g., not booted up or in hibernation).

As a second example, a computing device may include an enclosure to house one or more input devices, one or more processors, and a swipeable portion comprising: (i) a material having a textured surface, (ii) a primary sensor to receive audio waves conducted by the material, where the primary sensor is mounted between two layers of vibration damping material to decouple the primary sensor from vibrations transmitted by the enclosure, (iii) one or more indicator lights visible through the material, and (iv) an EC configured with logic instructions. The swipeable portion of the computing device may include a textured surface having at least one of: (i) a first bump having a first height to generate a first frequency, (ii) a second bump having a second height to generate a second frequency, or (iii) a third bump having a third height to generate a third frequency. The EC may receive primary data from the primary and filter the primary data to create filtered data. For example, the EC may filter the primary data to create the filtered data by filtering out frequencies not created by the swipe gesture on the swipeable portion of the computing device using a bandpass filter to create the filtered data. The EC may determine whether the filtered data satisfies one or more criteria. For example, the EC may determine whether an amplitude of the filtered data is greater than a first threshold. The EC may determine whether a length of the filtered data is greater than a second threshold (e.g., 500 ms). The EC may determine whether input is being received from one or more input devices. The EC may receive second data from a secondary sensor that is coupled to the enclosure of the computing device, filter the second data to create second filtered data, and determine whether a second amplitude of the second filtered data is less than the amplitude of the filtered data. Based on the results of one or more of the determinations, the EC may determine whether a swipe gesture was performed on a swipeable portion of the computing device. If the EC determines that the swipe gesture was performed, the EC may perform one or more actions associated with the swipe gesture. For example, the EC may perform at least one of: (i) determining and displaying, using one or more indicator lights, a battery level associated with a battery of the computing device, (ii) modifying a contrast level of a display device of the computing device to create a modified contrast level and displaying the modified contrast level using the one or more indicator lights, (iii) modifying a brightness level of a display device of the computing device to create a modified brightness level and displaying the modified brightness level using the one or more indicator lights, (iv) modifying an audio output level of the computing device to create a modified audio output level and displaying the modified audio output level using the one or more indicator lights, or (v) modifying an audio input level of the computing device to create a modified audio input level and displaying the modified audio input level using the one or more indicator lights. The one or more actions associated with the swipe gesture may be performed without using the one or more processors (e.g., without booting the computing device if the computing device is off or in a hibernation state).

FIG. 1 is a block diagram of a computing device 100 having a swipeable portion, according to some embodiments. While the computing device 100 is illustrated as being a laptop computer, the systems and techniques described herein may be applied to other portable computing devices, such as, for example, a tablet, a smartphone, a smartwatch, or the like.

The computing device 100 may include a first housing 102 coupled to a second housing 104 using one or more hinges 106. The first housing 102 may include one or more input devices, such as a keyboard, a trackpad, and the like. The second housing 104 may include a display device.

One of the housings 102, 104 may include a swipeable portion 110 that can be swiped by a user appendage, such as a user's hand 108. In FIG. 1, a top view of the swipeable portion 110 is illustrated as being located on a front edge of the first housing 102. However, it should be understood that the swipeable portion 110 may be located anywhere in either the first housing 102 or the second housing 104. In addition, while a single swipeable portion 110 is illustrated in FIG. 1, it should be understood that the computing device 100 may include more than one swipeable portion.

The swipeable portion 110 may include a circuit 112 that includes an embedded controller (EC) 114. A primary sensor 116 may be connected to the circuit 112. While the EC 114 is shown as being separate from the primary sensor 116, in some cases, the EC 114 may be incorporated into the primary sensor 116. The primary sensor 116 may be mounted in such a way as to decouple the sensor 116 from the housing 102 to reduce the amplitude of non-swipe generated vibrations that are picked up by the primary sensor 116. For example, the primary sensor 116 may be sandwiched between two layers of vibration damping (e.g., viscoelastic) material.

One or more indicator lights 118 may be connected to the circuit 112. The lights 118 may be part of a liquid crystal display (LCD), light emitting diodes (LED), organic light emitting diodes (OLED), or the like. In some cases, multiple lights, such as five lights 118, may be used to provide an indication as to a level, such as a battery level of the computing device 102. The number of the lights 118 that are illuminated may be proportional to the battery level. For example, all five lights 118 may be illuminated to indicate a full battery level, a single light 118 may be illuminated to indicate a nearly empty battery, and two or more lights 118 may be illuminated to indicate a partial battery level. Of course, in other cases, a single light 118 may be used. For example, when using a single light 118, the brightness of the light 118 may be proportional to the battery level, with very bright indicating a full battery, very dim indicating a nearly empty battery, and in-between brightness levels indicating partial battery levels. As another example, when using a single light 118 capable of displaying multiple colors, the color of the light 118 may indicate the battery level, with green indicating a full battery, yellow indicating a partially full battery, and red indicating a nearly empty battery.

A strip of material 120 may be used to gather and conduct the sound (e.g., audio) created by a swipe to the primary sensor 116. The material 120 may be a type of transparent or translucent plastic to enable the indicator lights 118 to be viewed. In some cases, the material 120 may be hollow to enable the material 120 to conduct (or amplify) the sound created by a swipe. For example, the material 120 may be hollowed out to include a cylindrical shaft to conduct the audio waves created by a swipe. In some cases, the diameter of the cylindrical shaft in the material 120 may be tuned to emphasize (e.g., increase the amplitude of) certain frequencies. As another example, the material 120 may be hollowed out to include a cone-shaped shaft to conduct and amplify the audio waves created by a swipe. The wide end of the cone-shape may be located near the primary sensor 116 while the narrow end may be located further from the primary sensor 116, e.g., closer to where the swipe gesture may be performed. The material 120 may include a textured (e.g., striated) edge 122. Except for the textured edge 122, which is exposed to enable a user to swipe the textured edge 122, the remainder of the swipeable portion 110 may be located inside the housing 102.

The thickness of this strip is 0.6 mm in the z-direction so it is very discrete to the device ID, but allows adequate user contact surface and light pipe area.

A secondary sensor 124 may be located inside the housing 102. The secondary sensor 124 may be coupled to the housing 102 to enable the secondary sensor 124 to detect non-swipe generated vibrations to enable the circuit 112 to use differential signaling to determine when a swipe occurred.

For example, assume that the action to be performed when a swipe is detected is to display a battery level of a battery 130 of the computing device 100. This action may be performed regardless of whether the computing device 100 is powered on or powered off. When the user's hand 108 is used to swipe the textured edge 122, the sound created by the swipe may be carried by the material 120 to the primary sensor 116. The primary sensor 116 may convert the analog sound into motion-generated data 126 (e.g., vibration data, acoustic signal data, and/or audio data) and send the motion-generated data 126 to the EC 114 for processing. The secondary sensor 124 may pick up sounds (e.g., ambient noise from the environment, vibrations transmitted by the housing 102, and the like), and send motion-generated data 128 to the EC 114. The EC 114 may process the motion-generated data 126, 128 to determine whether the motion-generated data 126 indicates that a user performed a swipe gesture across the textured edge 122 of the material 120. For example, the textured edge 122 of the material 120 may be created in such a way so to emit a particular set of frequencies when swiped. The EC 114 may filter the motion-generated data 126 using a low pass (or a band pass) filter to remove (or reduce the amplitude of) frequencies not in the particular set of frequencies to create filtered data 132.

The EC 114 may determine whether an amplitude of the filtered data 132 satisfies a first (e.g., amplitude) threshold. If the amplitude of the filtered data 132 does not satisfy the first threshold, then no action may be performed. If the amplitude of the filtered data 132 satisfies the first threshold then, prior to performing an associated action, in some cases, one or more additional conditions may be determined. The EC 114 may determine whether a length time associated with the swipe satisfies a second (e.g., length) threshold. For example, the EC 114 may determine a length of time that a signal in the filtered data 132 satisfies the first threshold to determine a length of time associated with the swipe. If the length of the signal in the filtered data 132 does not satisfy the second (e.g., length) threshold (e.g., at least M milliseconds (ms), M>0, such as M=400 ms, 500 ms, 600 ms or the like), then no action may be performed. If the length of the signal in the filtered data 132 satisfies the second threshold (e.g., at least 400 ms, 500 ms, 600 ms or the like), then, prior to performing an associated action, in some cases, one or more additional conditions may be determined. The EC 114 may compare a first amplitude of first audio in the filtered data 132 (e.g., from the primary sensor 116) with a second amplitude of second audio in the filtered data 134 (e.g., from the secondary sensor 124). If the second amplitude is the same as or greater than the first amplitude, then vibrations received by the secondary sensor 124 may have also been received by the primary sensor 116, and no action may be performed. If the second amplitude is less than the first amplitude, then the user may have performed a swipe gesture on the swipeable area 110, then, prior to performing an associated action, in some cases, one or more additional conditions may be determined. If input is being received from an input device, such as a keyboard or a track pad of the computing device 100, then the primary sensor 116 may be detecting vibrations caused by the use of the input device, and no action may be performed. If input is not being received from an input device, such as a keyboard or a track pad of the computing device 100, then, prior to performing an associated action, in some cases, one or more additional conditions may be determined. The filtered data 132, 134 may be created in the digital domain, e.g., using digital signal processing (DSP), or in the analog domain, e.g., using resistor-capacitor (RC) filtering.

After the EC 114 has determined that one or more conditions have been satisfied (e.g., amplitude satisfies a threshold, length of signal satisfies a threshold, amplitude of data from secondary sensor 124 less than amplitude of data from primary sensor 116, input devices are not in use, and the like), the EC 114 may perform one or more associated actions, such as, for example, determining and displaying the battery level of the battery 130 using the lights 118, modifying a parameter (e.g., contrast, brightness, or the like) of a display device and displaying an amount of the modified parameter using the lights 118, modifying a volume of an audio output or a speaker and displaying an amount of the modified volume using the lights 118, or modifying another parameter associated with the computing device 100 and displaying an amount of the modified parameter using the lights 118.

Thus, a computing device, such as a laptop, tablet, smartphone, or smartwatch, may provide a swipeable portion that has a textured (e.g., striated) exterior surface. The textured surface may include bumps having one or more sizes to generate a particular sound signature (e.g., a particular set of frequencies). When a user performs a swipe gesture on the swipeable portion, a primary sensor may detect the vibrations and capture motion-generated data generated by the swipe gesture. An EC may filter (e.g., band pass filtering or the like) the motion-generated data to filter out frequencies that are not included in the sound signature (e.g., a particular set of frequencies that are generated when a swipe gesture is performed on the swipeable portion). The EC may analyze the filtered motion-generated data, including determinizing an amplitude and a length of the filtered motion-generated data, to determine if the motion-generated data was generated by a deliberate gesture. The EC may also take into account second motion-generated data received from a secondary sensor to determine if the motion-generated data was generated by a deliberate gesture. If the EC determines that the motion-generated data was generated by a deliberate gesture, then the EC may perform one or more actions associated with the gesture, such as determining and displaying a battery level of a battery of the computing device, modifying and displaying a display device parameter (e.g., contrast, brightness, or the like), modifying and displaying an audio parameter (e.g., microphone level, speaker level, audio output level, or the like), or modifying and displaying another parameter associated with the computing device. In this way, false triggers can be reduced to prevent the actions associated with the swipe gesture from being performed when the user accidently brushes up against the swipeable portion, when the swipeable portion is rubbed when being placed in, taken out of, or carried in a bag, when the user is providing input using a keyboard, trackpad, or the like, or other situations in which contact is accidentally or incidentally made with the swipeable portion. After the EC determines that a swipe gesture has been performed, in some cases, the EC may receive additional input via the swipeable portion. For example, a swipe gesture may be followed by one or more number of taps on the swipeable portion, where the number of taps represents a different command. For example, a swipe gesture followed by one tap may cause the EC to determine and display a battery level of the computing device, a swipe gesture followed by two taps may cause the EC to determine and display a wireless connection status (e.g., with the number of lights indicating a signal strength of the wireless connection), a swipe gesture followed by three taps may cause the computing device to power on (e.g., boot up an operating system), and the like.

Figure 2A:
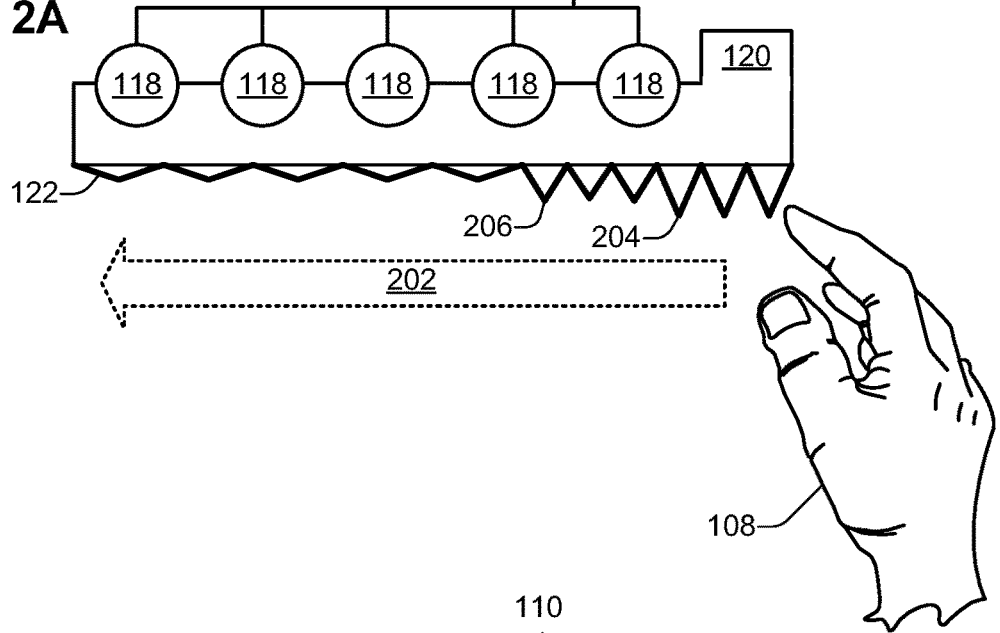
FIG. 2A is a block diagram illustrating detecting a swipe in a first direction along a swipeable portion of a computing device, according to some embodiments.

FIG. 2A is a block diagram illustrating detecting a swipe in a first direction along a swipeable portion of a computing device, according to some embodiments. In FIG. 2A, a user may use an appendage of the hand 108 to perform a swipe gesture in a first direction 202. The textured edge 122 may include a first bump 204 having a first height, a second bump 206 having a second height (e.g., less than the first height), and a remainder of the bumps of the textured edge 122 may have a third height (e.g., less than the second height). When swiped, each bump may produce a particular frequency based on the height of the bump. For example, a bump with a bigger height may produce a lower frequency than a bump with a smaller height. To illustrate, when swiped using a swipe gesture, the first bump 204 may produce a first frequency (e.g., 400 Hz), the second bump 206 may produce a second frequency (450 Hz), and the remaining bumps of the textured edge 122, having the third height, may produce a third frequency (e.g., 500 Hz). When a user performs a swipe gesture in the first direction 202, the first bump 204 may be swiped before the second bump 206. The EC 114 may receive the motion-generated data 126 from the sensor 116 and filter the motion-generated data 126 to create the filtered data 132. The EC 114 may analyze the filtered data 132, determine that the first frequency occurs before the second frequency, and determine that the swipe gesture was performed in the first direction 202.

Figure 2B:
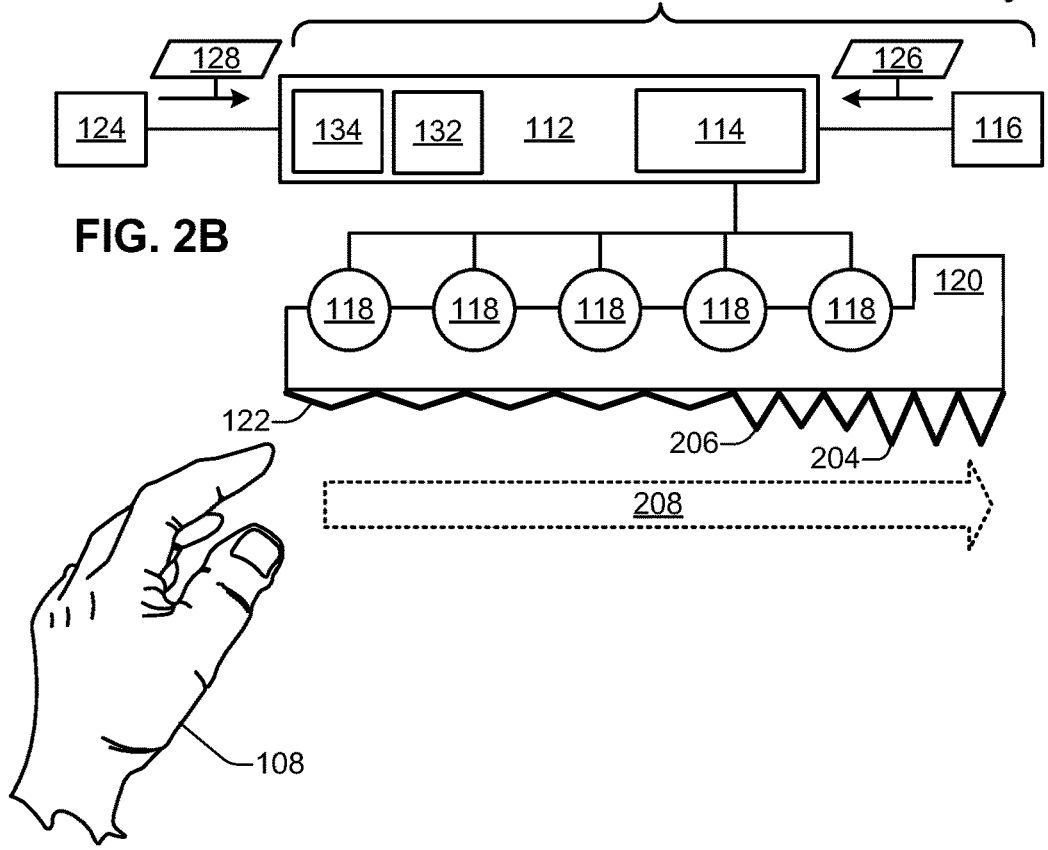
FIG. 2B is a block diagram illustrating detecting a swipe in a second direction along a swipeable portion of a computing device, according to some embodiments.

FIG. 2B is a block diagram illustrating detecting a swipe in a second direction along a swipeable portion of a computing device, according to some embodiments. In FIG. 2B, a user may use an appendage of the hand 108 to perform a swipe gesture in a second direction 208. When a user performs a swipe gesture in the second direction 208, the second bump 206 may be swiped before the first bump 204. The EC 114 may receive the motion-generated data 126 from the sensor 116 and filter the motion-generated data 126 to create the filtered data 132. The EC 114 may analyze the filtered data 132, determine that the first frequency occurs after the second frequency, and determine that the swipe gesture was performed in the second direction 208.

After determining the direction 202 or 208 in which a swipe gesture was performed, the EC 114 may perform one or more associated actions. For example, after determining that the swipe gesture was in the first direction 202, the EC 114 may cause a brightness of a display device to be decreased, a contrast of the display device to be decreased, a volume of a speaker or an audio output to be decreased, a volume of a microphone (or other input device) to be decreased, or the like. After determining that the swipe gesture was in the second direction 208, the EC 114 may cause a brightness of a display device to be increased, a contrast of the display device to be increased, a volume of a speaker or an audio output to be increased, a volume of a microphone (or other input device) to be increased, or the like.

The textured edge 122 may be between about 10 to 50 millimeters (mm) in length, and preferably about 25 mm in length. The bumps on the textured edge 122 may be between about 0.10 mm to about 0.50 mm in height (e.g., proud the surface), and preferably 0.25 mm proud the surface. The bumps on the textured edge 122 may be between about 1.00 to 3.00 wide, and preferably about 1.85 mm wide with a period of between 3 to 4 mm, and preferably about 3.83 mm. Thus, for example, if two or more bumps are 0.5 mm in height, the bumps may generate a higher frequency vibration when a swipe gesture is performed. If one or more bumps has a width of 1.0 mm and a spacing of 2.0 mm, then the frequency of the bumps may be different.

Figure 3:
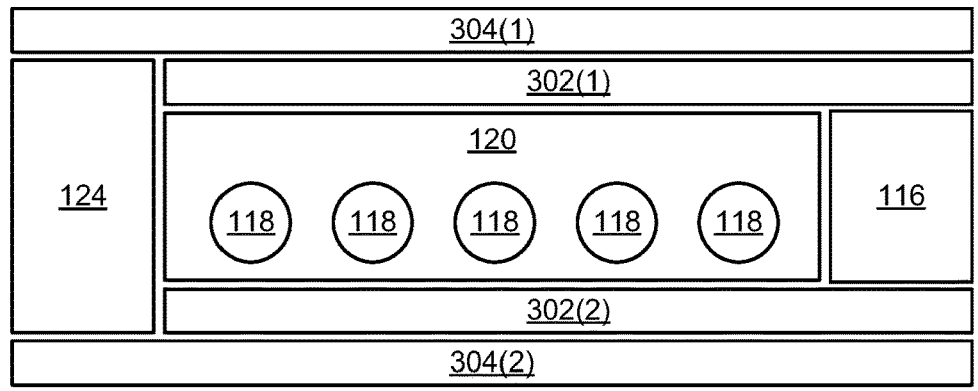
FIG. 3 is a block diagram illustrating using isolation mounting to reduce false triggering, according to some embodiments.

FIG. 3 is a block diagram illustrating using isolation mounting to reduce false triggering, according to some embodiments. The primary sensor 116 and the material 120 (through which the lights 118 can be viewed), may be mounted between two pieces of vibration damping foam 302(1) and 302(2) (or other viscoelastic material) to isolate both the primary sensor and the material 120 (e.g., which is used to conduct or amplify sound waves to the primary sensor 116) from vibrations transmitted through housings 304(1), 304(2). For example, the housings 304(1), 304(2) may be a top portion and a bottom portion, respectively, of the housing 102 (or the housing 104) of FIG. 1. The vibration damping foam 302(1), 302(2) may be tuned (e.g., based on the density of the materials used to create the vibration damping foam 302) to reject and/or increase particular frequencies. For example, the vibration damping foam 302(1), 302(2) may be tuned to pass through or increase a volume of frequencies (e.g., 300-500 Hz) generated by a swipe gesture on the swipeable portion 110 while decreasing (e.g., damping) other frequencies (e.g., frequencies below 300 Hz and above 500 Hz).

By mounting the primary sensor 116 and the material 120 between the vibration damping material 302(1), 302(1), vibrations conducted by the housings 304(1), 304(2) may be damped (e.g., reduced in volume) before the vibrations reach the primary sensor 116, thereby reducing the possibility false triggering. Vibrations conducted by the housings 304 may include vibrations caused by placing in a bag the computing device 100 of FIG. 1, removing the computing device 100 from the bag, incidental contact of the computing device 100 with the inside lining of the bag when being carried, the user making contact with a portion of the computing device 100 that does not include the material 120, and the like.

To enable the EC 114 of FIG. 1 to distinguish vibrations conducted by the housings 304(1), 304(2) from vibrations caused by a user performing a swipe gesture on the material 120, the secondary sensor 124 may be used to provide a differential signal. The secondary sensor 124 may be mounted in such a way that the secondary sensor 124 makes contact with the housings 304(1), 304(2). In this way, if the motion-generated data provided by the secondary sensor 124 has the same or greater amplitude as compared to the motion-generated data provided by the primary sensor 116, then the EC 114 may determine that the vibrations picked up by the primary sensor 116 are a false trigger and the EC 114 may not perform an associated action. If the motion-generated data provided by the secondary sensor 124 has an amplitude that is a predetermined amount less than the motion-generated data provided by the primary sensor 116, then the EC 114 may determine that the vibrations picked up by the primary sensor 116 are caused by a swipe gesture and the EC 114 may perform the associated action (e.g., determining and displaying a battery level). By comparing the two signals from the primary sensor 116 and the secondary sensor 124, the EC 114 can determine whether or not a swipe gesture occurred, thereby reducing false triggers.

Figure 4A:
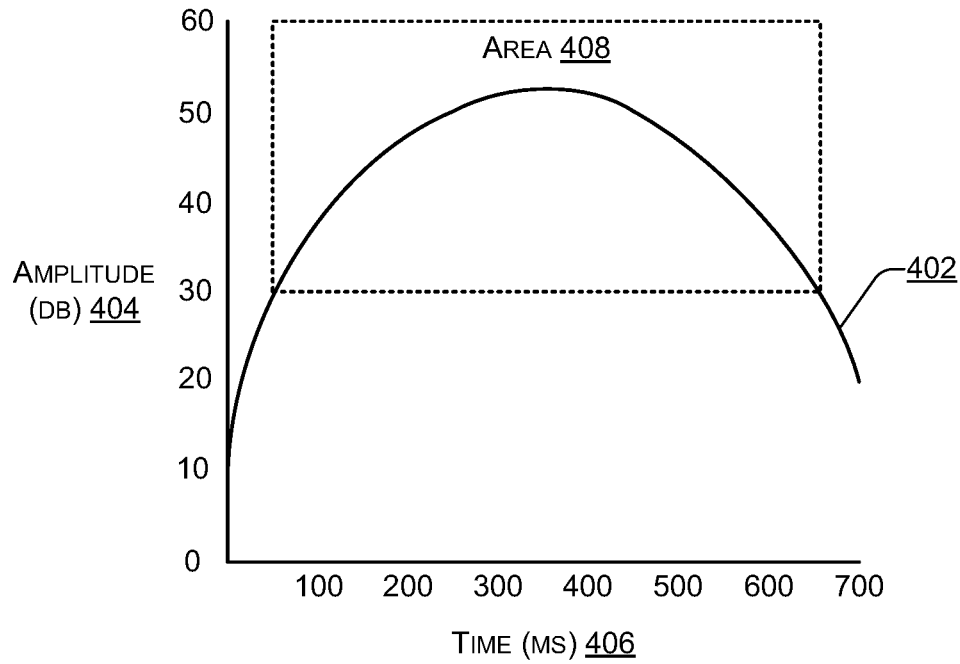
FIG. 4A is a block diagram illustrating a first example of filtered audio, according to some embodiments.

FIG. 4A is a block diagram illustrating a first example of filtered audio, according to some embodiments. The EC 114 of FIG. 1 may analyze filtered audio data 402 (e.g., one of the filtered audio data 132, 134) to determine an amplitude 404 of the filtered audio data 402 and a length of time 406 that the amplitude 404 satisfies a first predetermined threshold. For example, the EC 114 may determine an area 408 in which the amplitude 404 exceeds a threshold of 30 db. The EC 114 may determine if the length of the time 406 in the area 408 satisfies a second predetermined threshold. For example, based on the area 408, the EC 114 may determine that the amplitude 404 exceeds 30 db for about 600 ms (e.g., 650 ms−50 ms=600 ms), which exceeds a threshold of 500 ms. In this example, if the filtered audio data 402 is the filtered audio data 132 from the primary sensor 116, then the EC 114 may determine that a swipe gesture was performed on the swipeable portion 110 and perform one or more associated actions.

Figure 4B:
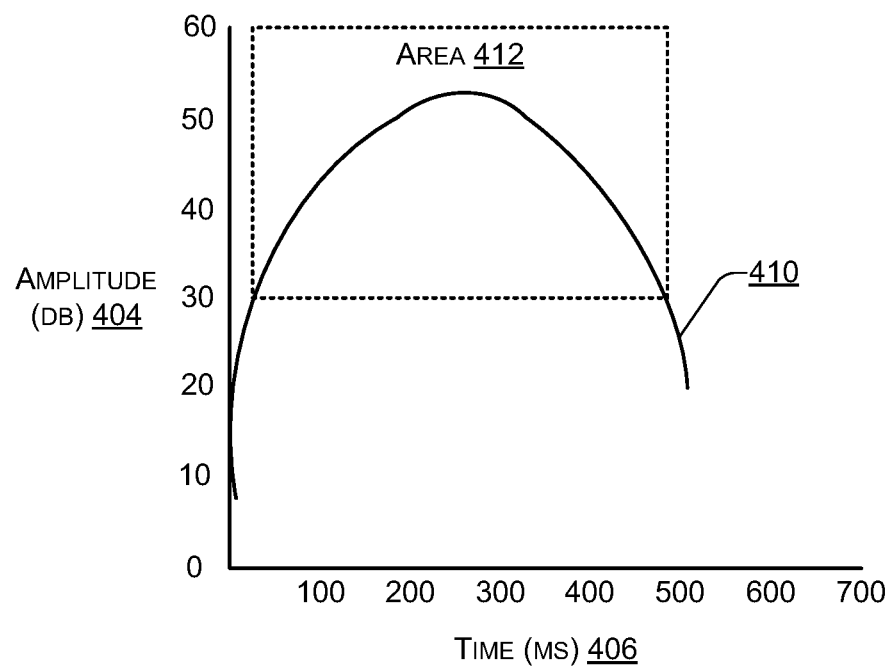
FIG. 4B is a block diagram illustrating a second example of filtered audio, according to some embodiments.

FIG. 4B is a block diagram illustrating a second example of filtered audio, according to some embodiments. The EC 114 of FIG. 1 may analyze filtered audio data 410 (e.g., one of the filtered audio data 132, 134) to determine the amplitude 404 of the audio data 402 and the length of time 406 that the amplitude 404 satisfies a first predetermined threshold. For example, the EC 114 may determine an area 412 in which the amplitude 404 exceeds a threshold of 30 db. The EC 114 may determine if the length of the time 406 in the area 412 satisfies a second predetermined threshold. For example, based on the area 412, the EC 114 may determine that the amplitude 404 exceeds 30 db for about 450 ms (e.g., 475 ms−25 ms=450 ms), which does not satisfy the threshold of 500 ms. In this example, if the filtered audio data 410 is the filtered audio data 132 from the primary sensor 116, then the EC 114 may determine that a swipe gesture was not performed on the swipeable portion 110 and perform no action.

In FIG. 1, the EC 114 may compare a first amplitude of first audio in the filtered data 132 (e.g., from the primary sensor 116) with a second amplitude of second audio in the filtered data 134 (e.g., from the secondary sensor 124). For example, assume the filtered audio data 402 is the filtered data 132 from the primary sensor 116 and the filtered audio data 410 is the filtered data 134 from the secondary sensor 124. The EC 114 may do a comparison of areas 408, 412 to determine whether the area 412 has a maximum amplitude less than (or within a predetermined threshold of) a maximum amplitude of the area 408. For example, as illustrated in FIGS. 4A and 4B, area 408 and area 412 both have a maximum amplitude of about 52.5 db. In such cases, the EC 114 may determine that non-swipe generated vibrations may have been received by both the primary sensor 116 and the secondary sensor 124, and no action may be performed. If the EC 114 determines that the maximum amplitude of area 412 is less than the maximum amplitude of area 408, then the EC 114 may determine that a swipe gesture was performed and the EC 114 may perform one or more associated actions (e.g., determining and displaying a battery level).

In some cases, the EC 114 may do a comparison of areas 408, 412 to determine whether the area 412 has a maximum amplitude within a predetermined threshold of a maximum amplitude of the area 408. For example, assume that by mounting the primary sensor 116 between the vibration damping materials 302 of FIG. 3, vibrations transmitted by the housing 304 are reduced by P db (e.g., P=3 db, 6 db or the like). If the maximum amplitude of area 408 is greater than the maximum amplitude of area 408 plus P, then the EC 114 may determine that a swipe gesture was performed and perform one or more associated actions. For example, the EC 114 performs an action if Maximum Amplitude of Area 408>(Maximum Amplitude of Area 408+P)

where P=amount of vibrational damping from materials 302.

If the maximum amplitude of area 408 is less than or equal to the maximum amplitude of area 408 plus P, then the EC 114 may determine that a swipe gesture was not performed (e.g., the vibrations were not generated by a swipe) and the EC 114 may perform no action.

Figure 5:
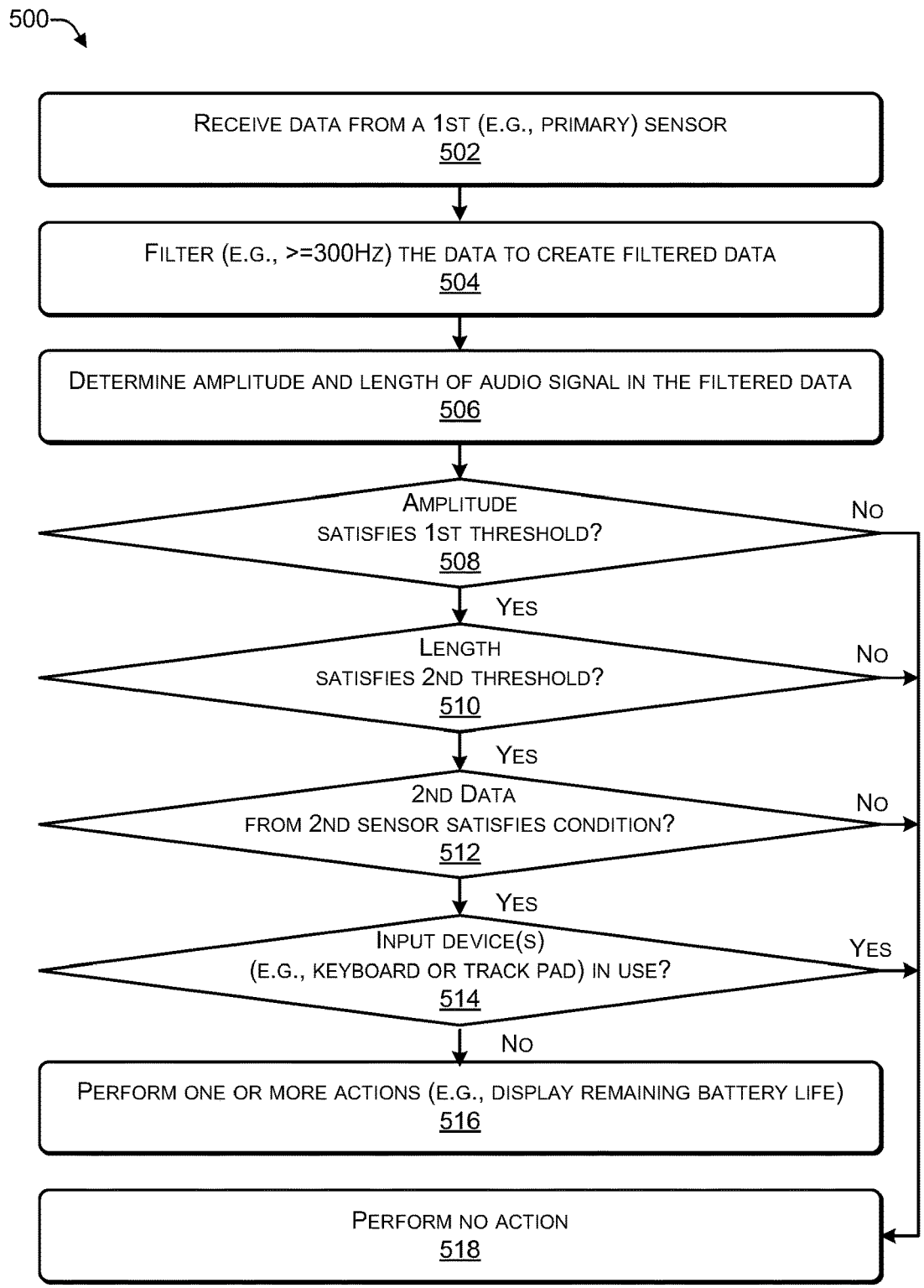
FIG. 5 is a flowchart of a process that uses at least two sensors to provide noise rejection, according to some embodiments.

In the flow diagram of FIG. 5, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 400, is described with reference to FIGS. 1, 2, 3, and 4 as described above, although other models, frameworks, systems and environments may be used to implement these processes.

FIG. 5 is a flowchart of a process 500 that uses at least two sensors to provide noise rejection, according to some embodiments. For example, the process 500 may be performed by the EC 114 of FIG. 1 and FIG. 2.

At 502, the process may receive data from a first (e.g., primary) sensor. At 504, the process filters the data to create filtered data. At 506, the process may determine an amplitude and a length of an audio signal in the filtered data. For example, in FIG. 1, after the hand 108 swipes the textured edge 122, the sound created by the swipe may be carried by the material 120 to the primary sensor 116. The textured edge 122 of the material 120 may be created in such a way as to emit a particular set of frequencies ("swipe generated frequencies") when swiped. The primary sensor 116 may convert the analog sound into digital motion-generated data 126 and send the motion-generated data 126 to the EC 114. The EC 114 may filter the motion-generated data 126 using a filter (e.g., band pass filter) to reduce the amplitude of non-swipe generated frequencies to create the filtered data 132.

At 508, the process may determine if the amplitude of the filtered data satisfies a first threshold. If the process determines that "yes" the amplitude satisfies the first threshold, then the process proceeds to 510. If the process determines that "no" the amplitude does not satisfy the first threshold, then the process proceeds to 518, where no action is performed. For example, in FIG. 1, the EC 114 may determine whether an amplitude of the filtered data 132 satisfies a first (e.g., amplitude) threshold, e.g., whether the amplitude is greater than X db, where X=20, 30, 40, 50, 60, 70, 80, 90 db or the like. If the amplitude of the filtered data 132 does not satisfy the first threshold, then no action may be performed. If the amplitude of the filtered data 132 satisfies the first threshold then, prior to performing an associated action, in some cases, one or more additional conditions (e.g., 410, 412, 414) may be determined.

At 510, the process may determine if the length of the filtered data satisfies a second threshold. If the process determines that "yes" the length satisfies the second threshold, then the process proceeds to 512. If the process determines that "no" the length does not satisfy the second threshold, then the process proceeds to 518, where no action is performed. For example, in FIG. 1, the EC 114 may determine whether a length time associated with the swipe satisfies a second (e.g., length) threshold. For example, the EC 114 may determine a length of time that a signal in the filtered data 132 satisfies the first threshold to determine a length of time associated with the swipe. If the length of the signal in the filtered data 132 does not satisfy the second (e.g., length) threshold (e.g., at least M milliseconds (ms), M>0, such as M=400 ms, 500 ms, 600 ms or the like), then no action may be performed. If the length of the signal in the filtered data 132 satisfies the second threshold (e.g., at least 400 ms, 500 ms, 600 ms or the like), then, prior to performing an associated action, in some cases, one or more additional conditions may be determined.

At 512, the process may determine if second data from a second sensor satisfies a particular condition (e.g., a maximum amplitude of the second data is at least a predetermined amount Z less than the maximum amplitude of the filtered data, e.g., Z=1 db, 3 db, 10 db, or the like). If the process determines that "yes" the particular condition is satisfied, then the process proceeds to 514. If the process determines that "no" the particular condition is not satisfied, then the process proceeds to 518, where no action is performed. For example, in FIG. 4, a comparison of areas 408, 412 may be performed to determine whether the area 412 has a maximum amplitude within a predetermined threshold of a maximum amplitude of the area 408. Assume that by mounting the primary sensor 116 between the vibration damping materials 302 of FIG. 3, vibrations transmitted by the housing 304 are reduced by P db (e.g., P=3 db, 6 db or the like). If the maximum amplitude of area 408 is greater than the maximum amplitude of area 408 plus P, then the EC 114 may determine that a swipe gesture was performed and perform one or more associated actions. If the maximum amplitude of area 408 is less than or equal to the maximum amplitude of area 408 plus P, then the EC 114 may determine that a swipe gesture was not performed (e.g., the vibrations were not generated by a swipe) and the EC 114 may perform no action.

At 514, the process may determine if one or more input devices are being used. If the process determines that "yes" one or more input devices are being used, then the process proceeds to 518, where no action is performed. If the process determines that "no" the one or more input devices are not in use, then the process proceeds to 516, where one or more actions (e.g., associated with a swipe gesture) are performed. For example, in FIG. 1, if the EC 114 determines that input is being received from an input device, such as a keyboard or a track pad of the computing device 100, then the EC 114 may determine that the primary sensor 116 is detecting vibrations caused by the use of the input device, and not perform an action. If the EC 114 determines that input is not being received from an input device, such as a keyboard or a track pad of the computing device 100, then, prior to performing an action associated with the swipe gesture, in some cases, one or more additional conditions may be determined. If the conditions 508, 510, 512, and 514 are satisfied, then one or more actions associated with the swipe gesture may be performed. For example, the actions may include determining and displaying a battery level, modifying a contrast of a display device, modifying a brightness of the display device, modifying a volume of an output device, modifying an input level of an input device, or the like. If the conditions are not satisfied, then no action may be performed. The process may perform the determinations 508, 510, 512, and 514 in a particular order that uses a least amount of battery power. For example, the determinations 508, 510, 512, and 514 that take the least amount of power to perform may be performed before the remaining determinations. To illustrate, the process may determine if input is being received from an input device and if yes, then the other determinations may not be performed.

Figure 6:
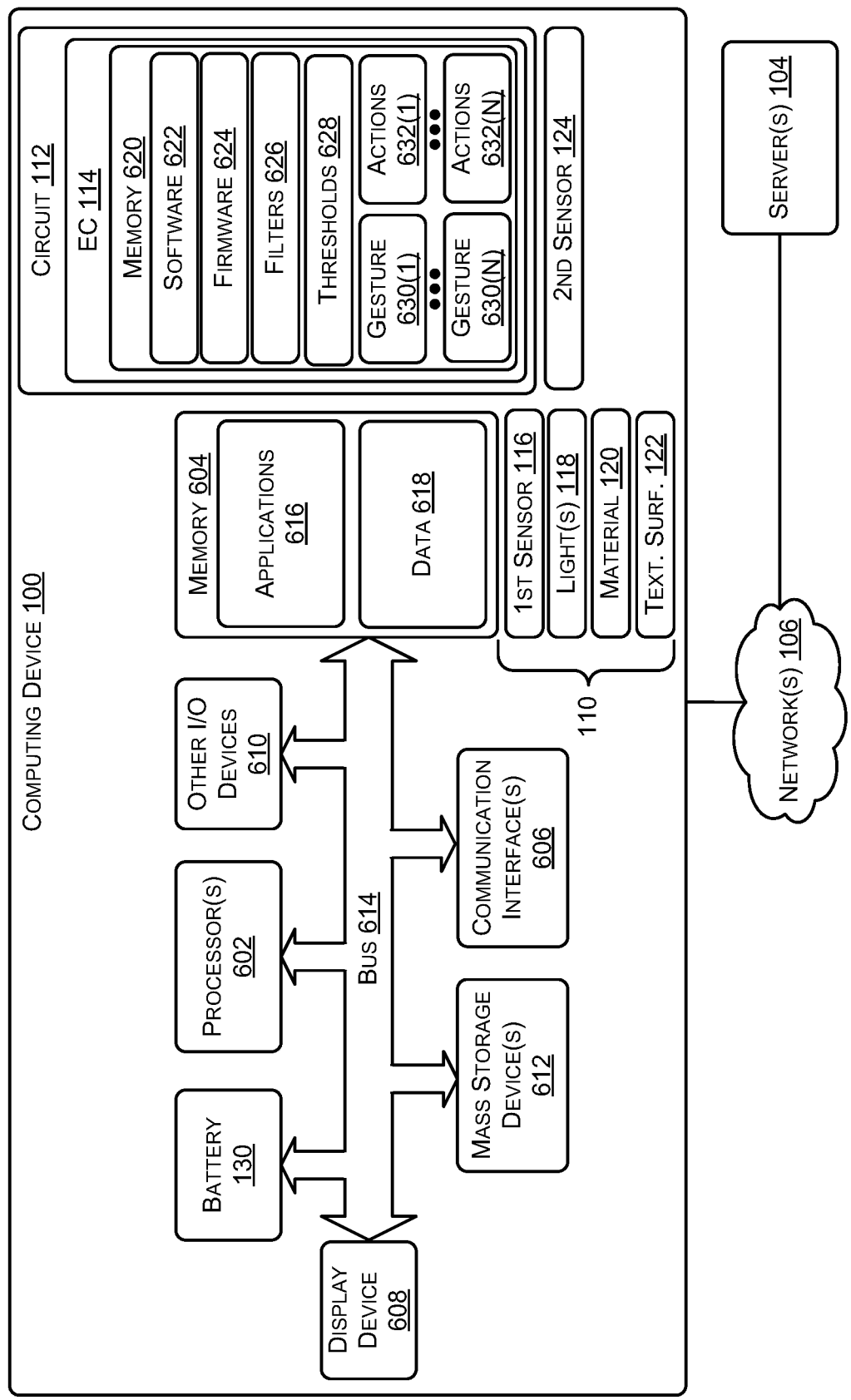
FIG. 6 illustrates an example configuration of a computing device that can be used to implement the systems and techniques described herein.

FIG. 6 illustrates an example configuration of a computing device 600 that can be used to implement the computing device 100. The computing device 102 may include one or more processors 602 (e.g., CPU, GPU, or the like), a memory 604, communication interfaces 606, a display device 608, other input/output (I/O) devices 610 (e.g., keyboard, trackball, and the like), and one or more mass storage devices 612 (e.g., disk drive, solid state disk drive, or the like), configured to communicate with each other, such as via one or more system buses 614 or other suitable connections. While a single system bus 614 is illustrated for ease of understanding, it should be understood that the system buses 614 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 602 are one or more hardware devices that may include a single processing unit or a number of processing units, all of which may include single or multiple computing units or multiple cores. The processors 602 may include a graphics processing unit (GPU) that is integrated into the CPU or the GPU may be a separate processor device from the CPU. The processors 602 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 602 may be configured to fetch and execute computer-readable instructions stored in the memory 604, mass storage devices 612, or other computer-readable media.

Memory 604 and mass storage devices 612 are examples of computer storage media (e.g., memory storage devices) for storing instructions that can be executed by the processors 602 to perform the various functions described herein. For example, memory 604 may include both volatile memory and non-volatile memory (e.g., RAM, ROM, or the like) devices. Further, mass storage devices 612 may include hard disk drives, solid-state drives, removable media, including external and removable drives, memory cards, flash memory, floppy disks, optical disks (e.g., CD, DVD), a storage array, a network attached storage, a storage area network, or the like. Both memory 604 and mass storage devices 612 may be collectively referred to as memory or computer storage media herein and may be any type of non-transitory media capable of storing computer-readable, processor-executable program instructions as computer program code that can be executed by the processors 602 as a particular machine configured for carrying out the operations and functions described in the implementations herein.

The computing device 600 may include one or more communication interfaces 606 for exchanging data via the network 106 (e.g., when the computing device 600 is connected to the dock 104). The communication interfaces 606 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 606 can also provide communication with external storage, such as a storage array, network attached storage, storage area network, cloud storage, or the like.

The display device 608 may be used for displaying content (e.g., information and images) to users. Other I/O devices 610 may be devices that receive various inputs from a user and provide various outputs to the user, and may include a keyboard, a touchpad, a mouse, a printer, audio input/output devices, and so forth. The computer storage media, such as memory 116 and mass storage devices 612, may be used to store software and data, such as, for example, one or more applications 616 and data 618.

The computing device 100 may include the swipeable portion 110, and the sensors 116, 124, the material 120 with the textured surface 122, and the lights 118. The EC 114 may include a memory 620 (e.g., including RAM and ROM) to store software 622, firmware 624, filters 626 (e.g., low pass, bandpass, and high pass filters), thresholds 628 (e.g., the various thresholds described herein), one or more gestures 630(1) to 630(N) (N>0), which each of the gestures 630(1) to 620(N) having a corresponding set of one or more actions 632(1) to 632(N).

Thus, the EC 114 may detect a user performing a swipe gesture to the swipeable portion 110 of the computing device 100. The computing device 100 may be a portable computing device (e.g., laptop, tablet, smartphone, smartwatch, or the like). When the user performs a swipe gesture to the swipeable portion 110 of the computing device 100, the EC 114 may, in response to detecting one of the gestures 630, perform one or more corresponding actions 632, such as determining and temporarily displaying an amount of battery life remaining in the battery 130, raising or lowering (e.g., depending on a direction of the swipe) a volume of an audio output (e.g., I/O devices 610), a brightness of the display device 608, a contrast of the display device 608, or another action related to the computing device 100. Various techniques and conditions are used, including the textured surface 122, vibration dampening materials 302, differential signaling from the two sensors 116 124, bandpass filtering (one of the filters 626), to reduce false triggers. A false trigger is the accidental or unintentional triggering of one or more actions associated with a swipe gesture.

The primary (e.g., first) sensor 116 may be placed near the swipeable portion 110 to detect vibrations generated by the swipe gesture. The primary sensor 116 may be mounted (e.g., sandwiched) between two pieces of vibrational damping material 302 of FIG. 3 to isolate the primary sensor 116 from other vibrations that may be transmitted by the enclosure 304. When the primary sensor 116 detects vibrations, the primary sensor 116 may wake the EC 114, which determines whether a swipe gesture occurred. If the EC 114 determines that a swipe gesture was performed, the EC 114 may determine a set of actions 632 associated with the swipe gesture 530. In this way, for example, the user can perform actions, such as displaying the battery level of the battery 130, without turning on (e.g., without booting up) the computer 100.

In some cases, the secondary sensor 124 may be located at a different location from the primary sensor 116. The second sensor 124 may be coupled to (or at least not isolated from) the enclosure 304 to enable the secondary sensor 124 to capture data (e.g., vibrations) not generated by a user swipe. The secondary sensor 124 may be used to provide noise rejection and prevent false triggering. For example, if both the primary sensor 116 and the secondary sensor 124 detect vibrations, then the data from both sensors 116, 124 may be compared to determine whether the user performed a swipe gesture, as described in FIG. 4.

Thus, the swipeable portion 110 located in a housing of the computing device 100 may be programmed to perform one or more actions 632 when a swipe gesture is detected along the swipeable portion 110. To increase the amplitude of the motion-generated data when a swipe gesture occurs, the swipeable portion may use material 120 that has the textured surface 122, such as striations or bumps. The motion-generated data may be filtered (e.g., bandpass filtering) to reduce the amplitude of frequencies not included in the particular set of frequencies created by the striations or bumps, further reducing the possibility of false triggering due to other vibrations transmitted by the enclosure (e.g., housing). By placing the primary sensor 116 near the swipeable portion 110 of the computing device 100 that includes the textured surface 122 and locating the secondary sensor 124 further away, false triggering can be reduced. The primary sensor 116 may be mounted between vibration damping (e.g., viscoelastic) material to decouple the primary sensor 116 from the enclosure, thereby reducing the amplitude of vibrations not originating from the swipeable portion 110. The secondary sensor 124 may be mounted further from the swipeable portion 110 and may be coupled to the enclosure to receive vibrations being transmitted by the enclosure. For example, if the motion-generated data received by the secondary sensor 124 has an amplitude that is the same or greater than the amplitude of motion-generated data received by the primary sensor 116, then no action may be performed because the motion-generated data was likely not generated by a swipe. In this way, the signal-to-noise ratio (also referred to as SNR or S/N ratio) of the motion-generated data generated by a swipe may be increased, thereby reducing false triggering due to the user incidentally brushing up against the swipeable portion and other (e.g., non-swipe generated) vibrations, such as being carried in a bag, being placed in or removed from a bag, being placed on a surface, and the like.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein.

On the contrary, it is intended to cover such alternatives, modifications, and equivalents as can be reasonably included within the scope of the invention as defined by the appended claims.

What is claimed is:

1. A method comprising:
  receiving, by an embedded controller of a computing device, primary data from a primary sensor mounted between vibration damping material that decouples the primary sensor from vibrations transmitted by a housing of the computing device;
  filtering, by the embedded controller, the primary data to create filtered data;
  receiving second data from a secondary sensor;
  filtering the second data to create second filtered data;
  the embedded controller comparing, by the embedded controller, the filtered data with the second filtered data;
  in response to the comparing, determining, by the embedded controller and while the computing device is in either a powered on state or a low power state, that a swipe gesture was performed on a swipeable portion of the computing device, wherein the swipeable portion of the computing device comprises:
    a first bump having a first height to generate a first frequency; and
    a second bump having a second height to generate a second frequency; and
  causing, by the embedded controller, one or more actions associated with the swipe gesture to be performed.

2. The method of claim 1, wherein filtering the primary data to create the filtered data comprises:
  filtering out frequencies not created by the swipe gesture on the swipeable portion of the computing device using a bandpass filter to create the filtered data.

3. The method of claim 1, wherein the vibration damping material comprises viscoelastic material.

4. The method of claim 1, wherein the swipeable portion of the computing device further comprises:
  a textured surface; and
  a third bump having a third height to generate a third frequency.

5. The method of claim 1, wherein performing the one or more actions associated with the swipe gesture comprises performing at least one of:
  determining and displaying, using one or more indicator lights, a battery level associated with a battery of the computing device;
  modifying a contrast level of a display device of the computing device to create a modified contrast level and displaying the modified contrast level using the one or more indicator lights;
  modifying a brightness level of a display device of the computing device to create a modified brightness level and displaying the modified brightness level using the one or more indicator lights;
  modifying an audio output level of the computing device to create a modified audio output level and displaying the modified audio output level using the one or more indicator lights; or
  modifying an audio input level of the computing device to create a modified audio input level and displaying the modified audio input level using the one or more indicator lights.

6. The method of claim 1, wherein:
  the primary sensor comprises an accelerometer that includes the embedded controller.

7. A computing device comprising:
  an enclosure to house one or more input devices;
  one or more processors;
  a swipeable portion comprising:
    a material having a textured surface, the textured surface comprising:
      a first bump having a first height to generate a first frequency; and
      a second bump having a second height to generate a second frequency;
  a primary sensor to receive audio waves; and
  an embedded controller configured with logic instructions to:
    receive primary data from the primary sensor;
    filter the primary data to create filtered data;
    receive second data from a secondary sensor that is coupled to the enclosure of the computing device;
    filter the second data to create second filtered data;
    comparing the filtered data with the second filtered data;
    in response to the comparing, while the computing device is in either a powered on state or a low power state, that a swipe gesture was performed on a swipeable portion of the computing device; and
    causing one or more actions associated with the swipe gesture to be performed.

8. The computing device of claim 7, wherein the embedded controller filters the primary data to create the filtered data by:
  filtering out frequencies not created by the swipe gesture on the swipeable portion of the computing device using a bandpass filter to create the filtered data.

9. The computing device of claim 7, wherein the primary sensor is mounted between two layers of vibration damping.

10. The computing device of claim 7, wherein the swipeable portion further comprises:
  a third bump having a third height to generate a third frequency.

11. The computing device of claim 7, wherein performing the one or more actions associated with the swipe gesture comprises performing at least one of:
  determining and displaying, using one or more indicator lights, a battery level associated with a battery of the computing device;
  modifying a contrast level of a display device of the computing device to create a modified contrast level and displaying the modified contrast level using the one or more indicator lights;
  modifying a brightness level of a display device of the computing device to create a modified brightness level and displaying the modified brightness level using the one or more indicator lights;
  modifying an audio output level of the computing device to create a modified audio output level and displaying the modified audio output level using the one or more indicator lights; or
  modifying an audio input level of the computing device to create a modified audio input level and displaying the modified audio input level using the one or more indicator lights.

12. The computing device of claim 7, wherein the low power state comprises either a powered off state or a hibernate state.

13. One or more non-transitory computer readable media storing instructions executable by an embedded controller to perform operations comprising:

receiving primary data from a primary sensor of a computing device;

filtering the primary data to create filtered data;

determining that the filtered data satisfies one or more criteria;

determining, while the computing device is in either a powered on state or a low power state, that a swipe gesture was performed on a swipeable portion of the computing device, wherein the swipeable portion of the computing device comprises:

a first bump having a first height to generate a first frequency; and a second bump having a second height to generate a second frequency; and causing one or more actions associated with the swipe gesture to be performed;

determining that one or more input devices are not in use;

receiving second data from a secondary sensor that is coupled to an enclosure of the computing device;

filtering the second data to create second filtered data; and determining that a second amplitude of the second filtered data is less than a first amplitude of the filtered data.

14. The one or more non-transitory computer readable media of claim 13, wherein filtering the primary data to create the filtered data comprises:

filtering out frequencies not created by the swipe gesture on the swipeable portion of the computing device using a bandpass filter to create the filtered data.

15. The one or more non-transitory computer readable media of claim 13, wherein the swipeable portion of the computing device comprises:

a textured surface; and a third bump having a third height to generate a third frequency.

16. The one or more non-transitory computer readable media of claim 13, wherein performing the one or more actions associated with the swipe gesture comprises performing at least one:

determining and displaying, using one or more indicator lights, a battery level associated with a battery of the computing device;

modifying a contrast level of a display device of the computing device to create a modified contrast level and displaying the modified contrast level using the one or more indicator lights;

modifying a brightness level of a display device of the computing device to create a modified brightness level and displaying the modified brightness level using the one or more indicator lights;

modifying an audio output level of the computing device to create a modified audio output level and displaying the modified audio output level using the one or more indicator lights; or modifying an audio input level of the computing device to create a modified audio input level and displaying the modified audio input level using the one or more indicator lights.

17. The one or more non-transitory computer readable media of claim 13, wherein the primary sensor comprises an accelerometer mounted between two layers of vibration damping material.

\* \* \* \* \*